(12) United States Patent
Niboshi et al.

(10) Patent No.: US 9,812,316 B2
(45) Date of Patent: Nov. 7, 2017

(54) MIXED MATERIAL, METHOD FOR PRODUCING SAME, AND ORGANIC ELEMENT USING SAME

(71) Applicant: Sharp Kabushiki Kaisha, Sakai, Osaka (JP)

(72) Inventors: Manabu Niboshi, Sakai (JP); Yuto Tsukamoto, Sakai (JP); Yoshiyuki Isomura, Sakai (JP); Satoshi Inoue, Sakai (JP); Hideki Uchida, Sakai (JP); Shinichi Kawato, Sakai (JP); Katsuhiro Kikuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/123,262

(22) PCT Filed: Feb. 18, 2015

(86) PCT No.: PCT/JP2015/054419
§ 371 (c)(1),
(2) Date: Sep. 2, 2016

(87) PCT Pub. No.: WO2015/133275
PCT Pub. Date: Sep. 11, 2015

(65) Prior Publication Data
US 2017/0058133 A1   Mar. 2, 2017

(30) Foreign Application Priority Data

Mar. 6, 2014   (JP) .................. 2014-043994

(51) Int. Cl.
*H01L 21/02* (2006.01)
*C23C 16/40* (2006.01)
(Continued)

(52) U.S. Cl.
CPC ........ *H01L 21/02274* (2013.01); *C23C 16/30* (2013.01); *C23C 16/404* (2013.01);
(Continued)

(58) Field of Classification Search
CPC . C23C 16/30; C23C 16/404; H01L 21/02274; H01L 51/5278; H01L 51/0583;
(Continued)

(56) References Cited

U.S. PATENT DOCUMENTS

2002/0150823 A1* 10/2002 Breitkopf ................ C23C 16/40
                                                                 429/245
2004/0189187 A1*  9/2004 Chang ................. H01L 51/5281
                                                                 313/503
(Continued)

FOREIGN PATENT DOCUMENTS

JP      2005-294058 A     10/2005
JP         4804469 B2     11/2011

OTHER PUBLICATIONS

Official Communication issued in International Patent Application No. PCT/JP2015/054419, dated Apr. 7, 2015.

*Primary Examiner* — Allan R Wilson
(74) *Attorney, Agent, or Firm* — Keating & Bennett, LLP

(57) ABSTRACT

A mixed material for vapor deposition of lithium contains lithium oxide M1 in an amount of 90% or more, sodium chloride (at least one material selected from oxides, sulfides, chlorides, and fluorides of alkali metals) M2 having a melting point lower than the melting point of lithium oxide M1, and magnesium oxide (at least one material selected from oxides and sulfides of alkaline-earth metals) M3 having a melting point higher than the melting point of lithium oxide M1.

8 Claims, 6 Drawing Sheets

(51) Int. Cl.

| | |
|---|---|
| *C23C 16/30* | (2006.01) |
| *H01L 51/52* | (2006.01) |
| *H01L 51/05* | (2006.01) |
| *H01L 51/10* | (2006.01) |
| *H01L 51/44* | (2006.01) |
| *H01L 51/50* | (2006.01) |
| *C09D 1/00* | (2006.01) |
| *C09D 5/24* | (2006.01) |
| *H01L 51/42* | (2006.01) |

(52) U.S. Cl.
CPC ........ *H01L 51/0583* (2013.01); *H01L 51/105* (2013.01); *H01L 51/441* (2013.01); *H01L 51/5012* (2013.01); *H01L 51/5092* (2013.01); *H01L 51/5221* (2013.01); *H01L 51/5231* (2013.01); *H01L 51/5278* (2013.01); *C09D 1/00* (2013.01); *C09D 5/24* (2013.01); *H01L 51/4253* (2013.01); *H01L 51/5206* (2013.01); *H01L 2251/301* (2013.01)

(58) Field of Classification Search
CPC ............... H01L 51/5221; H01L 51/441; H01L 51/5021; H01L 51/5092; H01L 51/105; H01L 51/5231
See application file for complete search history.

(56) References Cited

U.S. PATENT DOCUMENTS

| | | | |
|---|---|---|---|
| 2007/0018568 A1* | 1/2007 | Nagara | H01L 51/5048 313/504 |
| 2008/0042102 A1 | 2/2008 | Cattaneo et al. | |
| 2012/0061652 A1* | 3/2012 | Sugisawa | H01L 27/1225 257/40 |
| 2014/0145168 A1* | 5/2014 | Ohsawa | H01L 51/5016 257/40 |
| 2015/0188088 A1* | 7/2015 | Kubota | H01L 51/5268 257/40 |

* cited by examiner

MIXED MATERIAL, METHOD FOR PRODUCING SAME, AND ORGANIC ELEMENT USING SAME

TECHNICAL FIELD

The present invention relates to a mixed material for vapor deposition of lithium, a method for producing the mixed material, and an organic element using the mixed material.

BACKGROUND ART

In recent years, organic elements exemplified by OLEDs (organic EL displays) use lithium as an electron injection material. That is to say, such organic elements include a positive electrode, a negative electrode, and an active layer (recombination portion) which is provided between the positive electrode and the negative electrode and in which electrons and holes (positive holes) can recombine. Moreover, in such organic elements, in order to, for example, improve the efficiency of injection of charges (electrons) into the active layer, an electron injection layer (carrier generation layer) is provided on the negative electrode side of the active layer.

Lithium is preferably used for the above-described electron injection layer. However, as is well known, lithium metals have the property of reacting vigorously with water, and thus can also react with moisture in the atmosphere. This makes it impossible to easily handle lithium metals. To address this issue, practically, a lithium compound (mixed material) is used as a source material, and an electron injection layer composed of lithium is formed by performing, for example, vacuum deposition using this source material.

As an example of the above-described conventional mixed material, as described in, for example, Patent Document 1 below, a mixed material containing a lithium salt and a reducing agent, the lithium salt being selected from lithium titanate ($Li_2TiO_3$), lithium tantalate ($LiTaO_3$), lithium niobate ($LiNbO_3$), lithium tungstate ($Li_2WO_4$), and lithium zirconate ($Li_2ZrO_3$), has been proposed. It has been believed that this conventional mixed material makes it possible to obtain lithium more stably than a traditional mixed material using an alloy of lithium and aluminum.

CITATION LIST

Patent Document

Patent Document 1: Japanese Patent No. 4804469

DISCLOSURE OF INVENTION

Problem to be Solved by the Invention

However, the above-described conventional mixed material uses a composite oxide of lithium, and thus has the problem of high material cost. In particular, this conventional mixed material contains rare metals, and thus has the problem in that it is also difficult to reduce the cost of raw materials and hence the material cost of the mixed material. Furthermore, this conventional mixed material uses a heavy metal oxide such as titanium oxide ($TiO_3$), tantalum oxide ($TaO_3$), niobium oxide ($NbO_3$), tungsten oxide ($WO_4$), or zirconium oxide ($ZrO_3$), and thus has the problem in that it is difficult to simplify the production process of the mixed material.

In view of the above-described problems, an object of the present invention is to provide an inexpensive and easy-to-produce mixed material that enables vapor deposition of lithium, a method for producing the mixed material, and an organic element using the mixed material.

Means for Solving Problem

In order to achieve the above-described object, a mixed material according to the present invention is a mixed material for vapor deposition of lithium, the mixed material including:
lithium oxide in an amount of 90% or more;
at least one material selected from oxides, sulfides, chlorides, and fluorides of alkali metals and having a melting point lower than a melting point of the lithium oxide; and
at least one material selected from oxides and sulfides of alkaline-earth metals and having a melting point higher than the melting point of the lithium oxide.

The mixed material having the above-described configuration contains lithium oxide as a main ingredient. Moreover, a combination of at least one material selected from oxides, sulfides, chlorides, and fluorides of alkali metals and having a melting point lower than the melting point of the lithium oxide and at least one material selected from oxides and sulfides of alkaline-earth metals and having a melting point higher than the melting point of the lithium oxide is mixed in the mixed material. Thus, unlike the above-described conventional examples, an inexpensive and easy-to-produce mixed material that enables vapor deposition of lithium can be made.

Moreover, it is preferable that the mixed material is in the form of a sintered material obtained by sintering the lithium oxide, the at least one material selected from oxides, sulfides, chlorides, and fluorides of alkali metals, and the at least one material selected from oxides and sulfides of alkaline-earth metals.

In this case, the mixed material is easy to handle and can facilitate vapor deposition of lithium.

Moreover, the mixed material may contain the at least one material selected from oxides, sulfides, chlorides, and fluorides of alkali metals in an amount of 1 wt % to 10 wt %.

In this case, it is possible to improve the degree of packing and to obtain lithium with high efficiency.

Moreover, the mixed material may contain the at least one material selected from oxides and sulfides of alkaline-earth metals in an amount of 1 wt % to 10 wt %.

In this case, it is possible to prevent surface cracking and to obtain lithium with high efficiency.

Moreover, a method for producing a mixed material according to the present invention is a method for producing a mixed material for vapor deposition of lithium, the method including:
an addition step of adding to lithium oxide at least one material selected from oxides, sulfides, chlorides, and fluorides of alkali metals and having a melting point lower than a melting point of the lithium oxide and at least one material selected from oxides and sulfides of alkaline-earth metals and having a melting point higher than the melting point of the lithium oxide;
a pressure application step of applying a pressure to an intermediate material obtained in the addition step; and a sintering step of sintering the intermediate material to which the pressure is applied in the pressure application step.

With the method for producing a mixed material, the method having the above-described configuration, an inexpensive and easy-to-produce mixed material that enables vapor deposition of lithium can be made by sequentially performing the addition step, the pressure application step, and the sintering step.

Moreover, an organic element according to the present invention is an organic element having a positive electrode, a negative electrode, an active layer provided between the positive electrode and the negative electrode, and an electron injection layer provided on the negative electrode side of the active layer, wherein the electron injection layer is formed using any of the above-described mixed materials.

With the organic element having the above-described configuration, an electron injection layer composed of lithium can be easily and accurately formed.

Moreover, it is preferable that in the organic element, the negative electrode is formed using silver or a transparent electrode material.

In this case, a negative electrode having superior corrosion resistance and being more resistant to processing than those using other metals such as aluminum can be made, and the design flexibility of the negative electrode can also be increased.

Moreover, in the organic element, a plurality of sets of the active layer and the electron injection layer may be provided between the positive electrode and the negative electrode.

In this case, an organic element having a tandem structure can be made, and a high-quality organic element can be easily made.

Effects of the Invention

According to the present invention, it is possible to provide an inexpensive and easy-to-produce mixed material that enables vapor deposition of lithium, a method for producing the mixed material, and an organic element using the mixed material.

DESCRIPTION OF THE INVENTION

Figure 1:
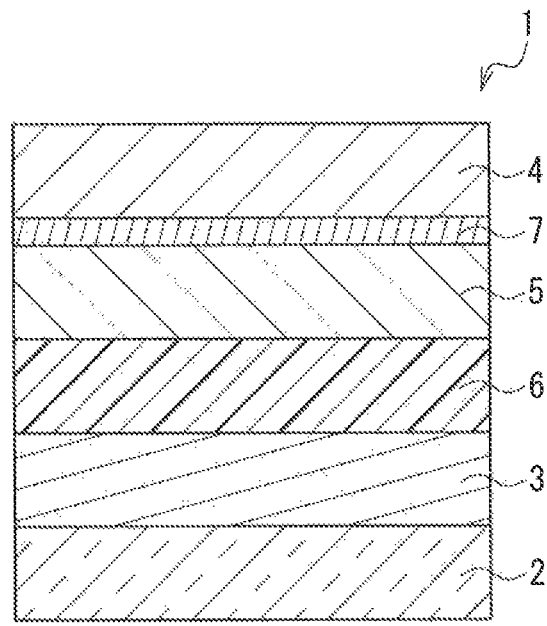
FIG. 1 is a cross-sectional view showing the configuration of an organic EL element using a mixed material according to a first embodiment of the present invention.

Hereinafter, preferred embodiments showing a mixed material of the present invention, a method for producing the mixed material, and an organic element using the mixed material will be described with reference to the drawings. It should be noted that in the following description, cases where the present invention is applied to an organic EL element, an organic thin-film solar cell, or an organic thin-film diode are described by way of example. Moreover, it should be understood that the dimensions of various constituent members in the drawings are not faithful representations of the dimensions of actual constituent members, dimensional ratios of those constituent members, and the like.

First Embodiment

FIG. 1 is a cross-sectional view showing the configuration of an organic EL element using a mixed material according to a first embodiment of the present invention. In FIG. 1, an organic EL element 1 of the present embodiment includes a substrate 2, a first electrode 3 provided on the substrate 2 and serving as a positive electrode, and a second electrode 4 provided above the first electrode 3 and serving as a negative electrode. Moreover, in the organic EL element 1, a light emitting layer 5, a hole transport layer 6, and an electron injection layer (carrier generation layer) 7 are provided between the first electrode 3 and the second electrode 4.

A material such as, for example, glass is used for the substrate 2. A transparent electrode material such as, for example, ITO is used for the first electrode 3. The first electrode 3 has a thickness of 100 nm, for example.

For the second electrode 4, for example, silver, a transparent electrode material such as ITO or IZO, or the like is used. The second electrode 4 has a thickness of 100 nm, for example.

It should be noted that in addition to the above-described materials, the second electrode (negative electrode) 4 can also be made using a metal such as, for example, aluminum. However, a configuration in which the second electrode 4 is made using silver or a transparent electrode material as described above is preferred in that in the case where this configuration is adopted, a second electrode 4 having superior corrosion resistance and being more resistant to processing when compared with those using other metals such as aluminum can be made, and the design flexibility of the second electrode 4 can also be increased.

The light emitting layer 5 is an active layer (recombination layer) in which electrons and holes can recombine. Furthermore, the light emitting layer 5 doubles as an electron transport layer. That is to say, for example, trisaluminum ($Alq_3$) is used for this light emitting layer 5, and the light emitting layer 5 is configured to not only function as a light emitting layer but also function as an electron transport layer. Moreover, the light emitting layer 5 has a thickness of 60 nm, for example.

For the hole transport layer 6, for example, NPB is used. The hole transport layer 6 has a thickness of 60 nm, for example.

For the electron injection layer 7, the mixed material of the present embodiment is used. That is to say, the electron injection layer 7 is composed of lithium (Li) that is formed by performing, for example, vacuum deposition, and more specifically, for example, electron beam heating vapor deposition with respect to the mixed material of the present embodiment. The electron injection layer 7 has a thickness of 0.5 nm, for example.

It should be noted that in addition to the above-described vapor deposition methods, vapor deposition of lithium, that is, formation of a film (e.g., the electron injection layer 7) of lithium by vapor deposition of lithium can also be performed using, for example, resistance heating vapor deposition or crucible heating vapor deposition using a crucible. However, with regard to the crucible heating vapor deposition, since lithium oxide, which is the main ingredient of the mixed material of the present embodiment and which will be described later, reacts vigorously with silicon (Si) at high temperature, if the crucible is a crucible (ceramic crucible) using silicon, there is a risk that a hole may be formed in the ceramic crucible. Moreover, although a silicon-free crucible, for example, a crucible using PBN can be used because of its low reactivity with lithium oxide, the crucible using PBN is expensive. Therefore, it is preferred to perform the electron beam heating vapor deposition, in which a heating hearth made from, for example, heat-resistant ceramics is used, because in that case, vapor deposition of lithium can be performed at low cost and easily.

Figure 2:
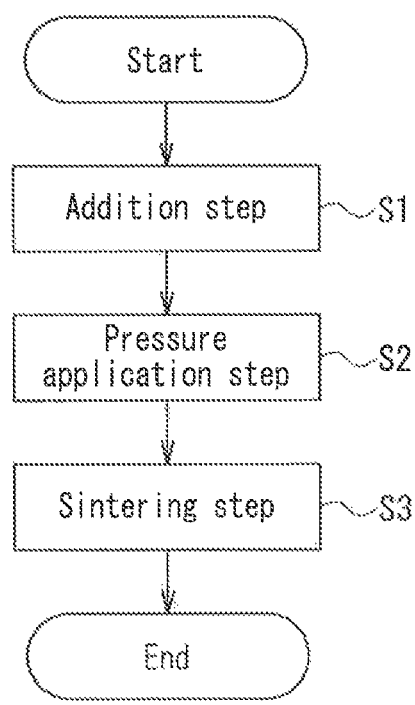
FIG. 2 is a flowchart illustrating a method for producing the mixed material.

Now, the mixed material of the present embodiment will be specifically described using FIGS. 2 and 3.

Figure 3A:
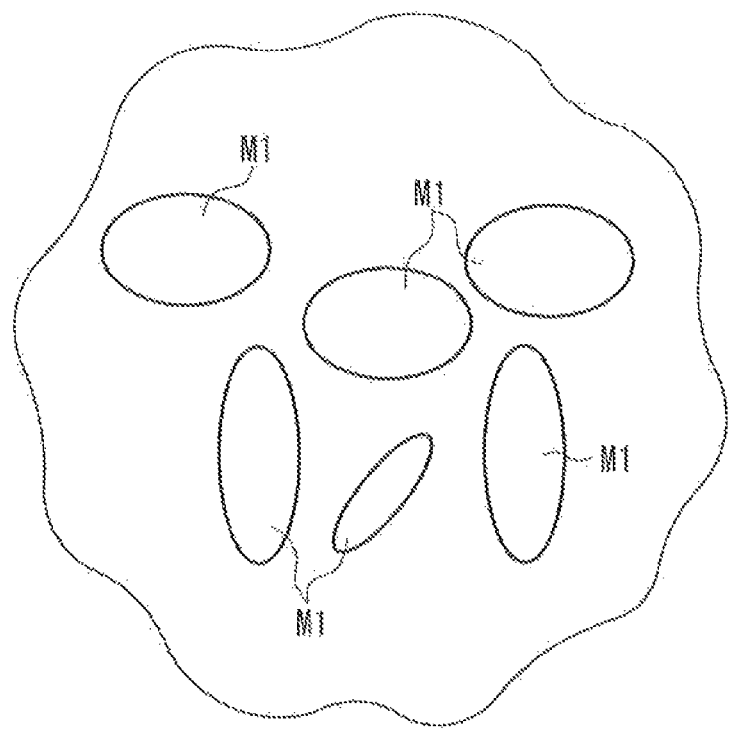
FIG. 3A is a diagram for explaining the molecular structure of Comparative Example 1.
Figure 3B:
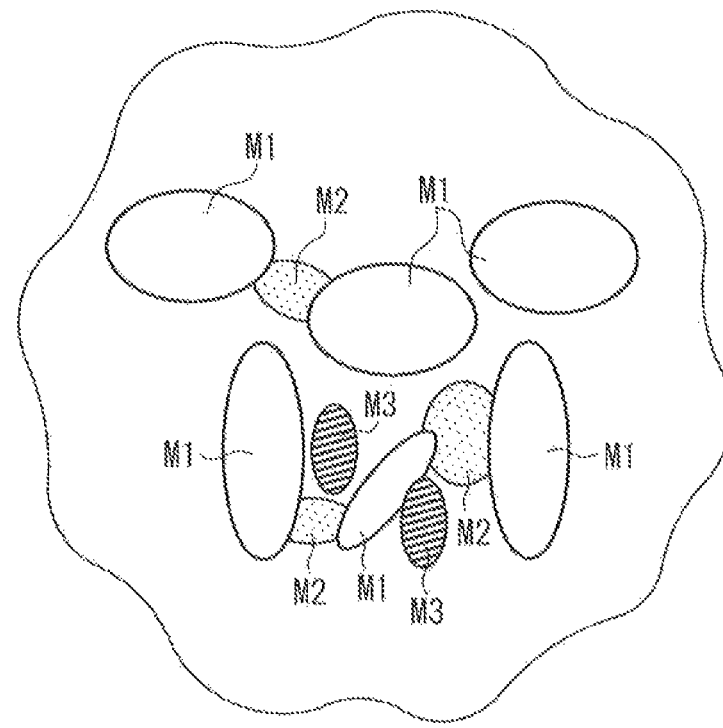
FIG. 3B is a diagram for explaining the molecular structure of a product of the present embodiment.

FIG. 2 is a flowchart illustrating a method for producing the mixed material. FIG. 3A is a diagram for explaining the molecular structure of Comparative Example 1, and FIG. 3B is a diagram for explaining the molecular structure of a product of the present embodiment.

The mixed material of the present embodiment contains lithium oxide ($Li_2O$) as the main ingredient. Also, an alkali metal compound, for example, sodium chloride (NaCl), the alkali metal compound having a melting point lower than the melting point (1700 degrees) of lithium oxide, and an alkaline-earth metal compound, for example, magnesium oxide (MgO), the alkaline-earth metal compound having a melting point higher than the melting point of lithium oxide, are added to the lithium oxide.

More specifically, the mixed material of the present embodiment contains lithium oxide in an amount of 90% or more in terms of molar ratio. Moreover, it is preferable that the lithium oxide content in the mixed material of the present embodiment is less than 95% in terms of molar ratio. Moreover, in the mixed material of the present embodiment, the amount of sodium chloride that is added is set to a value preferably within a range of 1 wt % to 10 wt %. Moreover, in the mixed material of the present embodiment, the amount of magnesium oxide that is added is set to a value preferably within a range of 1 wt % to 10 wt %.

It should be noted that if the molar ratio (composition ratio) of lithium oxide is less than 90%, there is a risk that lithium cannot be efficiently extracted in vapor deposition of lithium.

On the other hand, if the molar ratio of lithium oxide is 95% or more, there is a risk that a source material (target material) of lithium cannot be formed.

Moreover, if the amount of sodium chloride (alkali metal compound) that is added is less than 1 wt %, there is a risk that when the mixed material is formed, the degree of packing (packing density) of the mixed material may be low, making it difficult to perform vapor deposition of lithium.

On the other hand, if the amount of sodium chloride that is added is set to a value greater than 10 wt %, there is a risk that lithium cannot be efficiently extracted in vapor deposition of lithium.

Moreover, if the amount of magnesium oxide (alkaline-earth metal compound) that is added is less than 1 wt %, there is a risk that when the mixed material is formed, cracking may occur in a surface of the mixed material.

On the other hand, if the amount of magnesium oxide that is added is set to a value greater than 10 wt %, there is a risk that lithium cannot be efficiently extracted in vapor deposition of lithium.

Moreover, the mixed material of the present embodiment is made as a sintered material composed of lithium oxide, sodium chloride, and magnesium oxide.

That is to say, as shown in FIG. 2, in the method for producing the mixed material of the present embodiment, an addition step of adding sodium chloride and magnesium oxide to lithium oxide is performed (step S1) to obtain an intermediate material of the mixed material.

Next, a pressure application step of applying a pressure to the intermediate material obtained in the addition step above is performed (step S2).

Subsequently, a sintering step of sintering the intermediate material to which the pressure is applied in the pressure application step above is performed (step S3). Thus, the mixed material of the present embodiment in the form of a sintered material is produced.

More specifically, in the case where lithium oxide alone is simply pressed and sintered as Comparative Example 1, as illustrated in FIG. 3A, a gap is created between particles of lithium oxide M1. More particularly Comparative Example 1 is a sintered material obtained by packing lithium oxide in a mold, applying a pressure of for example, 100 $kgf/cm^2$ to the lithium oxide, and sintering the lithium oxide at, for example, 600 degrees for 2 hours or more in argon (Ar) atmosphere. Moreover, in Comparative Example 1, the packing density was 1.15 glee, whereas the theoretical packing density was 2.01 Wm. That is to say, with respect to Comparative Example 1, the degree of packing was about 57%, and it was difficult to achieve a stable vapor deposition rate during vapor deposition of lithium.

On the other hand, the product of the present embodiment was produced by adding, to lithium oxide in an amount of 90% in terms of molar ratio, for example, sodium chloride in an amount of 5 wt % and magnesium oxide in an amount of 5 wt % and performing pressure application and sintering under the same conditions as those for Comparative Example 1. As a result, with respect to the product of the present embodiment, the packing density was 1.3 Wm. That is to say, with respect to the product of the present embodiment, the degree of packing is about 65%, and it is possible to achieve a stable vapor deposition rate during vapor deposition of lithium (details will be described later).

More specifically, in the case of the product of the present embodiment, as illustrated in FIG. 3B, particles of sodium chloride M2 entered the gaps between particles of lithium oxide M1 and filled those gaps as a flux (welding material). Moreover, the product of the present embodiment contains particles of magnesium oxide M3 as illustrated in FIG. 3B, and these particles suppress the occurrence of cracking in the product of the present embodiment. That is to say, the particles of magnesium oxide M3 serve to alleviate an internal stress that is caused by a difference in the coefficient of thermal expansion between the materials during cooling after the sintering step and thus suppress the occurrence of cracking. Therefore, according to the present embodiment, a mixed material suitable for a vapor deposition material can be obtained.

Figure 4:
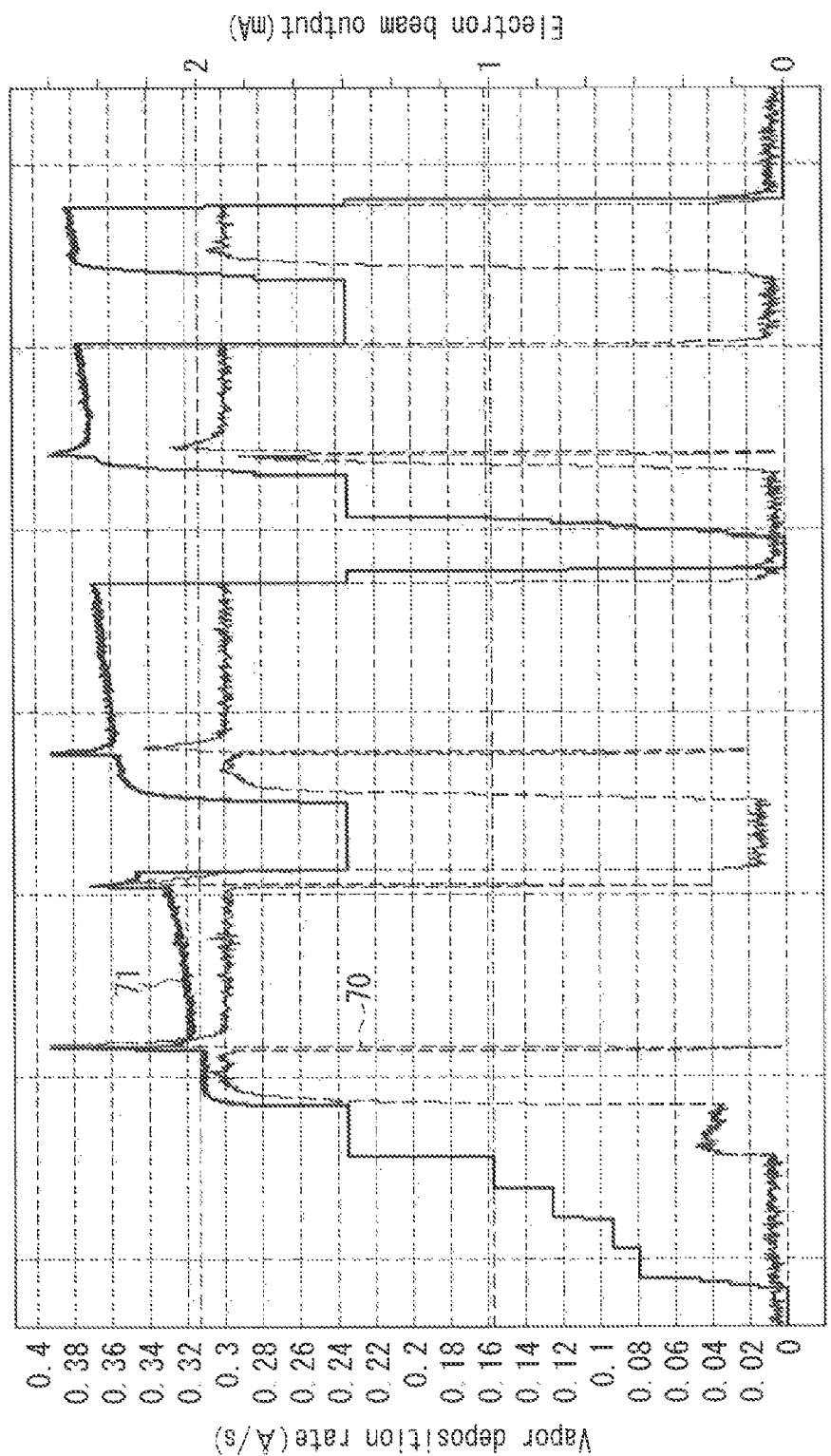
FIG. 4 is a graph illustrating a specific example of a vapor deposition rate and an electron beam output in the case where vapor deposition is performed using the product of the present embodiment.
Figure 5:
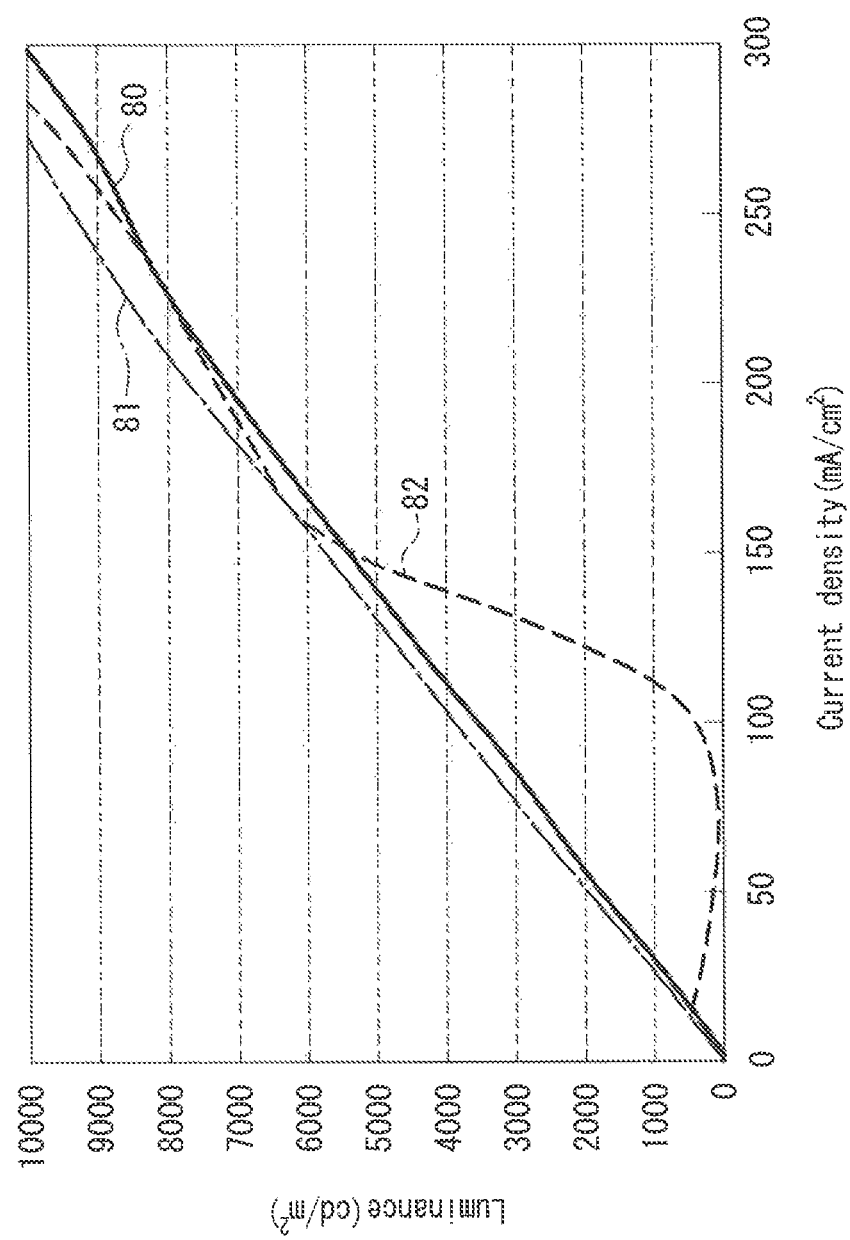
FIG. 5 is a graph for explaining an example of the results with respect to the characteristics of organic EL elements using the product of the present embodiment and Comparative Examples 1 and 2, respectively.

Next, referring to FIGS. 4 and 5, a production process of forming the electron injection layer 7 using the mixed material of the present embodiment and an example of the characteristics of the organic EL element 1 using the mixed material of the present embodiment will be specifically described.

FIG. 4 is a graph illustrating a specific example of a vapor deposition rate and an electron beam output in the case where vapor deposition is performed using the product of the present embodiment. FIG. 5 is a graph for explaining an example of the results with respect to the characteristics of organic EL elements using the product of the present embodiment and Comparative Examples 1 and 2, respectively.

In the present embodiment, as described above, the electron injection layer 7 is formed by performing electron beam heating vapor deposition with respect to the mixed material of the present embodiment.

More specifically, in the process of forming the electron injection layer 7, the mixed material of the present embodiment is placed on a heating hearth made from, for example, heat-resistant ceramics, and the mixed material is irradiated with electron rays (electron beam) emitted from an electron gun of an electron beam vapor deposition apparatus in a vacuum environment (e.g., less than $1.0 \times 10^{-4}$ Pa).

As indicated by a solid line 71 in FIG. 4, the mixed material of the present embodiment on the heating hearth was preheated by supplying power, less than 50 mA at an acceleration voltage, for example, 10 kV, to an electron emission filament of the electron gun, and then, after the mixed material was entirely heated, the current value was gradually increased and set at about 2 A. Thus, the vapor deposition rate of lithium obtained from the mixed material of the present embodiment was stable at the rate of 0.3 Å/s as illustrated by a dashed line 70 in FIG. 4. Vapor deposition of lithium was able to be performed stably as described above because the degree of packing of the mixed material of the present embodiment was 60% or more (e.g., about 65%).

Moreover, the organic EL element 1 using the mixed material of the present embodiment has stable, straight line-shaped light emission characteristics as indicated by a solid line 80 in FIG. 5. The values of the light emission characteristics of the organic EL element 1 are almost equal to those of the light emission characteristics (illustrated by a long dashed short dashed line 81 in FIG. 5) of Comparative Example 2 in which an electron injection layer was made using lithium fluoride (LiF).

Moreover, in Comparative Example 2, lithium fluoride (LiF) was used as the source material, and an electron injection layer composed of lithium fluoride was formed by so-called resistance heating vacuum deposition in which the source material was filled in a resistance heating boat or a heat-resistant crucible and heated in a vacuum environment (e.g., less than $1.0 \times 10^{-4}$ Pa). The electron injection layer of Comparative Example 2 had a thickness of 0.5 nm.

On the other hand, in Comparative Example 1 above, in which the electron injection layer was composed using lithium oxide alone, the electron injection layer was unable to be formed at a stable vapor deposition rate. Thus, with regard to the light emission characteristics of Comparative Example 1, as indicated by a dashed line 82 in FIG. 5, it was hard for electric current to flow (that is, electron injection in the electron injection layer did not properly progress) in an early stage of energization, and desired luminance was not achieved. It is inferred that this is because the electron injection layer was formed at an unstable vapor deposition rate, causing the problem in that instead of lithium, lithium oxide was deposited as is, or large lithium particles were deposited, or other problems, and accordingly, an electron injection layer having a uniform film thickness was not formed.

In the mixed material of the present embodiment having the above-described configuration, lithium oxide is contained in an amount of 90% or more and serves as the main ingredient. Moreover, a combination of sodium chloride (alkali metal compound) having a melting point lower than the melting point of lithium oxide and magnesium oxide (alkaline-earth metal compound) having a melting point higher than the melting point of the lithium oxide is mixed in the mixed material of the present embodiment. Thus, according to the present embodiment, unlike the above-described conventional examples, an inexpensive and easy-to-produce mixed material that enables vapor deposition of lithium can be made.

Moreover, the mixed material of the present embodiment is in the form of a sintered material obtained by performing sintering. Thus, the mixed material of the present embodiment is easy to handle and can facilitate vapor deposition of lithium.

Moreover, the mixed material of the present embodiment contains sodium chloride in an amount of 1 wt % to 10 wt %. Thus, it is possible to improve the degree of packing of the mixed material and to obtain lithium with high efficiency.

Moreover, the mixed material of the present embodiment contains magnesium oxide in an amount of 1 wt % to 10 wt %. Thus, it is possible to prevent surface cracking of the mixed material and to obtain lithium with high efficiency Moreover, according to the present embodiment, the electron injection layer 7 of the organic EL element 1 is formed using the above-described mixed material. Thus, the electron injection layer 7 can be easily and accurately formed.

Second Embodiment

Figure 6:
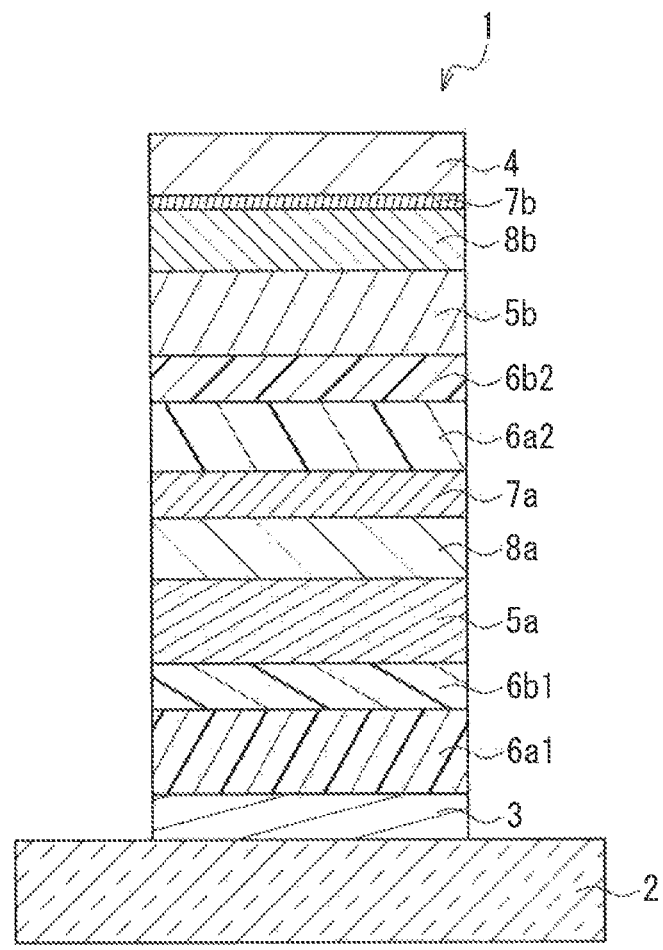
FIG. 6 is a cross-sectional view showing the configuration of an organic EL element using a mixed material according to a second embodiment of the present invention.

FIG. 6 is a cross-sectional view showing the configuration of an organic EL element using a mixed material according to a second embodiment of the present invention.

In FIG. 6, the present embodiment differs from the first embodiment mainly in that a plurality of sets of the light emitting layer (active layer) and the electron injection layer are provided between the first electrode (positive electrode) and the second electrode (negative electrode). It should be noted that the same elements as those of the first embodiment are denoted by the same reference numerals, and their redundant description is omitted.

That is to say, as shown in FIG. 6, in the organic EL element 1 of the present embodiment, a first hole injection layer 6a1 and a first hole transport layer 6b1 are sequentially formed on the first electrode 3 provided on the substrate 2. Also, a first light emitting layer 5a, a first electron transport layer 8a, and a first electron injection layer 7a are sequentially formed on the first hole transport layer 6b1.

Furthermore, in the organic EL element 1 of the present embodiment, a second hole injection layer 6a2 and a second hole transport layer 6b2 are sequentially formed on the first electron injection layer 7a. Also, a second light emitting layer 5b, a second electron transport layer 8b, and a second electron injection layer 7b are sequentially formed on the second hole transport layer 6b2. The second electrode 4 is provided on the second electron injection layer M. That is to say, the organic EL element 1 of the present embodiment has a tandem structure in which two sets of the light emitting layer and the electron injection layer, that is, the first light emitting layer 5a and the first electron injection layer 7a as well as the second light emitting layer 5b and the second electron injection layer 7b are provided between the positive electrode 3 and the negative electrode 4.

Moreover, the mixed material of the present embodiment is used for the first and second electron injection layers 7a and 7b. Like the mixed material of the first embodiment, the mixed material of the present embodiment contains lithium oxide, which serves as the main ingredient, in an amount of not less than 90% and less than 95% in terms of molar ratio.

Moreover, an alkali metal compound, for example, sodium oxide ($Na_2O$), the alkali metal compound having a melting point lower than the melting point of lithium oxide, and an alkaline-earth metal compound, for example, calcium oxide (CaO), the alkaline-earth metal compound having a melting point higher than the melting point of lithium oxide, are added to the mixed material of the present embodiment. The amounts of sodium oxide and calcium oxide, respectively, that are added are each adjusted to a value within a range of 1 wt % to 10 wt %.

With the above-described configuration, the present embodiment can achieve the same effects as those of the first embodiment. Moreover, according to the present embodiment, since the organic EL element 1 has the tandem structure, a high-quality organic EL element 1 can be easily made.

It should be noted that in addition to the above-described configuration, a configuration may also be adopted in which three or more sets of the light emitting layer and the electron injection layer are provided between the first electrode (positive electrode) and the second electrode (negative electrode).

Third Embodiment

Figure 7:
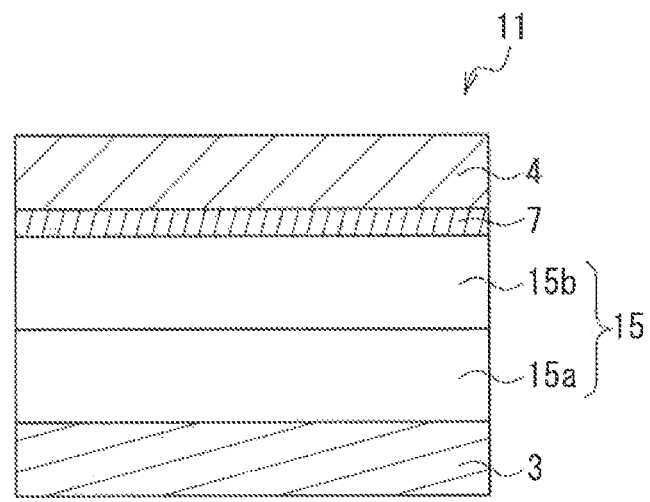
FIG. 7 is a cross-sectional view showing the configuration of an organic thin-film solar cell using a mixed material according to a third embodiment of the present invention.

FIG. 7 is a cross-sectional view showing the configuration of an organic thin-film solar cell using a mixed material according to a third embodiment of the present invention.

In FIG. 7, the present embodiment differs from the first embodiment mainly in that the mixed material of the present invention is used for an electron injection layer of the organic thin-film solar cell having a power generation layer as an active layer. It should be noted that the same elements as those of the first embodiment are denoted by the same reference numerals, and their redundant description is omitted.

That is to say, in FIG. 7, an organic thin-film solar cell 11 of the present embodiment includes, between the first electrode 3 and the second electrode 4, a power generation layer 15, which serves as the active layer, and the electron injection layer 7 provided on the second electrode 4 side of the power generation layer 15.

The power generation layer 15 has a p-type organic semiconductor 15a and an n-type organic semiconductor 15b. The p-type organic semiconductor 15a is connected to the first electrode 3 serving as a p-type electrode (positive electrode). The n-type organic semiconductor 15b is connected to the second electrode 4 serving as an n-type electrode (negative electrode) via the electron injection layer 7.

Moreover, the mixed material of the present embodiment is used for the electron injection layer 7. Like the mixed material of the first embodiment, the mixed material of the present embodiment contains lithium oxide, which serves as the main ingredient, in an amount of not less than 90% and less than 95% in terms of molar ratio.

Moreover, an alkali metal compound, for example, sodium sulfide ($Na_2S$), the alkali metal compound having a melting point lower than the melting point of lithium oxide, and an alkaline-earth metal compound, for example, magnesium sulfide (MgS), the alkaline-earth metal compound having a melting point higher than the melting point of lithium oxide, are added to the mixed material of the present embodiment. The amounts of sodium sulfide and magnesium sulfide, respectively, that are added are each adjusted to a value within a range of 1 wt % to 10 wt %.

With the above-described configuration, the present embodiment can achieve the same effects as those of the first embodiment. Moreover, since the electron injection layer 7 of the organic thin-film solar cell 11 of the present embodiment is formed using the mixed material of the present embodiment, an easy-to-produce and high-performance organic thin-film solar cell 11 can be produced at low cost.

Fourth Embodiment

Figure 8:
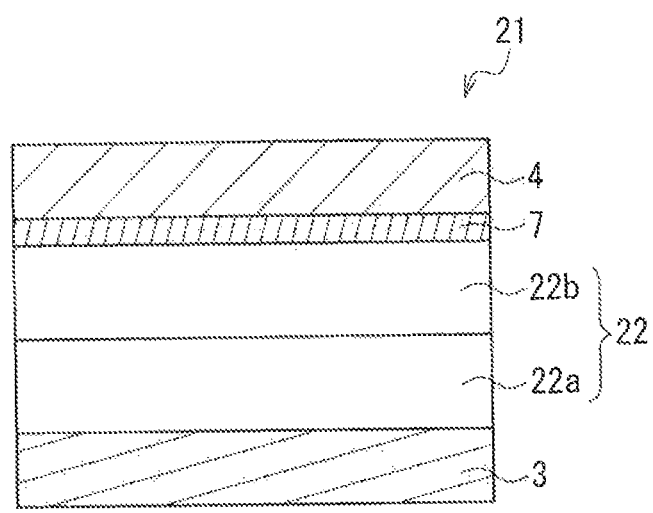
FIG. 8 is a cross-sectional view showing the configuration of an organic thin-film diode using a mixed material according to a fourth embodiment of the present invention.

FIG. 8 is a cross-sectional view showing the configuration of an organic thin-film diode using a mixed material according to a fourth embodiment of the present invention.

In FIG. 8, the present embodiment differs from the first embodiment mainly in that the mixed material of the present invention is used for an electron injection layer of an organic thin-film diode having an active layer. It should be noted that the same elements as those of the first embodiment are denoted by the same reference numerals, and their redundant description is omitted.

That is to say, in FIG. 8, an organic thin-film diode 21 of the present embodiment includes, between the first electrode 3 and the second electrode 4, an active layer 22 and the electron injection layer 7 provided on the second electrode 4 side of the active layer 22.

The active layer 22 has a p-type organic semiconductor 22a and an n-type organic semiconductor 22b. The p-type organic semiconductor 22a is connected to the first electrode 3 serving as a p-type electrode (positive electrode). The n-type organic semiconductor 22b is connected to the second electrode 4 serving as an n-type electrode (negative electrode) via the electron injection layer 7.

Moreover, the mixed material of the present embodiment is used for the electron injection layer 7. Like the mixed material of the first embodiment, the mixed material of the present embodiment contains lithium oxide, which serves as the main ingredient, in an amount of not less than 90% and less than 95% in terms of molar ratio.

Moreover, an alkali metal compound, for example, potassium fluoride (KF), the alkali metal compound having a melting point lower than the melting point of lithium oxide, and an alkaline-earth metal compound, for example, magnesium oxide (MgO), the alkaline-earth metal compound having a melting point higher than the melting point of lithium oxide, are added to the mixed material of the present embodiment. The amounts of potassium fluoride and magnesium oxide, respectively, that are added are each adjusted to a value within a range of 1 wt % to 10 wt %.

With the above-described configuration, the present embodiment can achieve the same effects as those of the first embodiment. Moreover, since the electron injection layer 7 of the organic thin-film diode 21 of the present embodiment is formed using the mixed material of the present embodiment, an easy-to-produce and high-performance organic thin-film diode 21 can be produced at low cost.

It should be noted that the foregoing embodiments are to be considered in all respects as illustrative and not restrictive. The technical scope of the invention is indicated by the appended claims, and all changes which come within the range of equivalency of the configurations specified in the claims are therefore intended to be embraced therein.

For example, in the foregoing description, in addition to lithium oxide, the cases where sodium chloride, sodium oxide, sodium sulfide, or potassium fluoride is used as the alkali metal compound having a melting point lower than the melting point of lithium oxide and the cases where magnesium oxide, calcium oxide, or magnesium sulfide is used as the alkaline-earth metal compound having a melting point higher than the melting point of lithium oxide have been described. However, the present invention is not limited to specific compounds as long as a combination of at least one material selected from oxides, sulfides, chlorides, and fluorides of alkali metals and having a melting point lower than the melting point of lithium oxide and at least one material selected from oxides and sulfides of alkaline-earth metals and having a melting point higher than the melting point of lithium oxide is added to lithium oxide.

Moreover, in the foregoing description, the cases where an organic EL element, an organic thin-film solar cell, or an organic thin-film diode is used as the organic element have been described. However, the present invention is not limited to specific types of organic element as long as the organic element has a positive electrode, a negative electrode, an active layer provided between the positive electrode and the negative electrode, and an electron injection layer provided on the negative electrode side of the active layer, and the mixed material of the present invention is used for the electron injection layer.

Moreover, in addition to the foregoing description, the above-described first to fourth embodiments may be combined as appropriate.

INDUSTRIAL APPLICABILITY

The present invention is useful for an inexpensive and easy-to-produce mixed material that enables vapor deposition of lithium, a method for producing the mixed material, and an organic element using the mixed material.

LIST OF REFERENCE NUMERALS

1 Organic EL element (organic element)
3 First electrode (positive electrode)
4 Second electrode (negative electrode)
5, 5a, 5b Light emitting layer (active layer)
7, 7a, 7b Electron injection layer
11 Organic thin-film solar cell
15 Power generation layer (active layer)
21 Organic thin-film diode
22 Active layer
M1 Lithium oxide
M2 Sodium chloride (at least one material selected from oxides, sulfides, chlorides, and fluorides of alkali metals)
M3 Magnesium oxide (at least one material selected from oxides and sulfides of alkaline-earth metals)

The invention claimed is:

1. A mixed material for vapor deposition of lithium, the mixed material comprising:
    lithium oxide in an amount of 90% or more;
    at least one material selected from oxides, sulfides, chlorides, and fluorides of alkali metals and having a melting point lower than a melting point of the lithium oxide; and
    at least one material selected from oxides and sulfides of alkaline-earth metals and having a melting point higher than the melting point of the lithium oxide.

2. The mixed material according to claim 1, wherein the mixed material is in the form of a sintered material obtained by sintering the lithium oxide, the at least one material selected from oxides, sulfides, chlorides, and fluorides of alkali metals, and the at least one material selected from oxides and sulfides of alkaline-earth metals.

3. The mixed material according to claim 1, wherein the mixed material contains the at least one material selected from oxides, sulfides, chlorides, and fluorides of alkali metals in an amount of 1 wt % to 10 wt %.

4. The mixed material according to claim 1, wherein the mixed material contains the at least one material selected from oxides and sulfides of alkaline-earth metals in an amount of 1 wt % to 10 wt %.

5. An organic element having a positive electrode, a negative electrode, an active layer provided between the positive electrode and the negative electrode, and an electron injection layer provided on the negative electrode side of the active layer,
    wherein the electron injection layer is formed using the mixed material according to claim 1.

6. The organic element according to claim 5, wherein the negative electrode is formed using silver or a transparent electrode material.

7. The organic element according to claim 5, wherein a plurality of sets of the active layer and the electron injection layer are provided between the positive electrode and the negative electrode.

8. A method for producing a mixed material for vapor deposition of lithium, the method comprising:
    an addition step of adding to lithium oxide at least one material selected from oxides, sulfides, chlorides, and fluorides of alkali metals and having a melting point lower than a melting point of the lithium oxide and at least one material selected from oxides and sulfides of alkaline-earth metals and having a melting point higher than the melting point of the lithium oxide;
    a pressure application step of applying a pressure to an intermediate material obtained in the addition step; and
    a sintering step of sintering the intermediate material to which the pressure is applied in the pressure application step.

* * * * *